United States Patent
Chen et al.

(10) Patent No.: US 9,706,682 B2
(45) Date of Patent: Jul. 11, 2017

(54) HEAT EXCHANGING MODULE AND ELECTRONIC DEVICE APPLYING THE SAME

(71) Applicant: DELTA ELECTRONICS, INC., Taoyuan (TW)

(72) Inventors: Lee-Long Chen, Taoyuan (TW); Wu-Chi Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/849,104

(22) Filed: Sep. 9, 2015

(65) Prior Publication Data

US 2016/0286684 A1  Sep. 29, 2016

(30) Foreign Application Priority Data

Mar. 24, 2015  (TW) .............................. 104109331 A

(51) Int. Cl.
  *H05K 7/20*  (2006.01)
  *F28F 3/02*  (2006.01)
  *F28D 9/00*  (2006.01)

(52) U.S. Cl.
  CPC ........... *H05K 7/202* (2013.01); *F28D 9/0062* (2013.01); *F28F 3/025* (2013.01)

(58) Field of Classification Search
  CPC ............. H05K 7/20009; H05K 7/0202; H05K 7/20163
  USPC .................................................. 361/690, 694
  See application file for complete search history.

(56) References Cited

U.S. PATENT DOCUMENTS

| 4,386,651 | A | * | 6/1983 | Reinhard | ............... | H05K 7/206 |
| | | | | | | 165/104.33 |
| 4,616,695 | A | * | 10/1986 | Takahashi | ............. | F28D 9/0068 |
| | | | | | | 165/166 |

* cited by examiner

*Primary Examiner* — Tuan T Dinh
*Assistant Examiner* — Mukund G Patel
(74) *Attorney, Agent, or Firm* — Muncy, Geissler, Olds & Lowe, P.C.

(57) ABSTRACT

A heat exchanging module comprises a casing, a plurality of first air guiding elements and a plurality of first separation elements. The first air guiding elements are disposed in the casing. Each of the first air guiding elements comprises a plurality of first structures and a plurality of second structures, the first structures are disposed parallelly, and the second structures are disposed between the first structures and connected with the first structures to form a plurality of first channels. Each of the first separation elements is disposed between the two adjacent first air guiding elements to form a second channel. An airflow direction of the first channels is different from that of the second channels. The present invention further provides an electronic device using the same.

6 Claims, 15 Drawing Sheets

HEAT EXCHANGING MODULE AND ELECTRONIC DEVICE APPLYING THE SAME

CROSS REFERENCE TO RELATED APPLICATIONS

This Non-provisional application claims priority under 35 U.S.C. §119(a) on Patent Application No(s). 104109331 filed in Taiwan, Republic of China on Mar. 24, 2015, the entire contents of which are hereby incorporated by reference.

BACKGROUND OF THE INVENTION

Field of Invention

The invention relates to a heat exchanging module and an electronic device applying the same and, in particular, to a heat exchanging module and an electronic device applying the same which can reduce the assembly time and cost.

Related Art

With the development of the electronic industry, the requirement of the operational speed and performance of the electronic device is raised, but the induced heat dissipating problem also becomes more serious and thus affects the operational performance and stability. For the normal operation of the electronic device, the electronic device is generally configured with a heat dissipating device so that the heat can be dissipated through the heat dissipating device.

However, if only the passive-type heat dissipating method is used, the heat can't be dissipated immediately and effectively. Therefore, the electronic device is usually configured with a cooling device to facilitate the heat dissipation. Currently, the cooling device applied to the electronic device is mainly a heat exchanging device, which is disposed in the electronic device to make a heat exchange between a cold airflow outside the electronic device and a hot airflow inside the electronic device so as to lower down the temperature inside the electronic device. FIG. 1A is a schematic perspective diagram of a conventional heat exchanging device, and FIG. 1B is a schematic side view showing the airflow path of the heat exchanging device in FIG. 1A. As shown in FIGS. 1A and 1B, the conventional heat exchanging device D includes an electronic device body D1, a heat exchanging module D2, a first fan D3 and a second fan D4. The heat exchanging module D2, the first fan D3 and the second fan D4 are disposed in the electronic device body D1, and the heat exchanging module D2 and the electronic device body D1 define and form an inward circulating path D5 and an outward circulating path D6 which are insulated from each other. The first fan D3 is disposed on the inward circulating path D5 to drive the inward circulating airflow, and that means the hot airflow caused by the operation of the electronic element E1 of the electronic apparatus E on a side of the electronic device body D1 is guided into the inward circulating path D5 of the heat exchanging device D. Meanwhile, the second fan D4 is disposed on the outward circulating path D6 to drive the outward circulating airflow, and that means the cold airflow outside the electronic apparatus E is guided from the other side of the electronic device body D1 to the outward circulating path D6 of the heat exchanging device D. Accordingly, the heat exchanging module D2 can provide a heat exchanging effect between the inward circulating airflow of relative higher temperature and the outward circulating airflow of relative lower temperature, so as to lower down the temperature of the inward circulating airflow and supply the inward circulating airflow to the electronic element E1 of the electronic apparatus E. Thereby, the effect of reducing the temperature inside the electronic apparatus E can be achieved.

In the heat exchanging module D2 of the conventional heat exchanging device D, a plurality of heat dissipating aluminum sheets A are arranged and disposed in a casing D7 to serve as a heat dissipating core (as shown in FIG. 1C). However, the heat dissipating aluminum sheets A need to be bent by a machine or formed by a stamping process, and then are stacked together after glues are applied on the L-shaped edges of the heat dissipating aluminum sheets A and the heat dissipating aluminum sheets A are rotated for 180 degrees. So, the assembly thereof is more complicated and takes much time. Besides, the thin-type aluminum sheets are used to bring a better heat dissipating effect, but the thin-type aluminum sheets possess insufficient rigidity and will be easily bent and deformed. Moreover, when the glues are not dried, the thin-type aluminum sheet are also easily displaced and tilted in the casing, so that the quality of the heat dissipating core composed of the conventional thin-type aluminum sheets is unstable.

Therefore, it is an important subject to provide a heat exchanging module which can be rapidly stacked through a simple design and disposition so as to possess a stronger rigidity.

SUMMARY OF THE INVENTION

In view of the foregoing subject, an objective of this invention is to provide a heat exchanging module which can be rapidly stacked through a simple design and disposition so as to possess a stronger rigidity.

To achieve the above objective, a heat exchanging module of this invention comprises a casing, a plurality of first air guiding elements and a plurality of first separation elements. The first air guiding elements are disposed in the casing. Each of the first air guiding elements comprises a plurality of first structures and a plurality of second structures, the first structures are disposed parallelly, and the second structures are disposed between the first structures and connected with the first structures to form a plurality of first channels. Each of the first separation elements is disposed between the two adjacent first air guiding elements to form a second channel. An airflow direction of the first channels is different from that of the second channels.

In one embodiment, the heat exchanging module further comprises a plurality of second air guiding elements and a plurality of second separation elements. Each of the second air guiding elements and each of the first separation elements are respectively disposed on two ends of the corresponding second channel. Each of the second air guiding elements comprises a plurality of first structures and a plurality of second structures, the first structures are disposed parallelly, and the second structures are disposed between the first structures and connected with the first structures to form a plurality of third channels. Each of the second separation elements is disposed between the two adjacent second air guiding elements to form a fourth channel.

In one embodiment, the first channels and the fourth channels communicate with each other to form a plurality of inward circulating channels (or outward circulating channels), respectively, the third channels and the second channels communicate with each other to form a plurality of outward circulating channels (or inward circulating channels), respectively, and the inward circulating channels and the outward circulating channels are disposed alternately and separately.

In one embodiment, the heat exchanging module further comprises a plurality of second separation elements. Each of the second separation elements is disposed between the two adjacent first air guiding elements, and each of the second separation elements and each of the first separation elements are respectively disposed on two ends of the corresponding second channel.

In one embodiment, the first channels have identical airflow direction, the second channels have identical airflow direction, and the airflow direction of the first channels is different from that of the second channels.

In one embodiment, the first channels and the second channels are inward circulating channels and outward circulating channels respectively or outward circulating channels and inward circulating channels respectively, and the inward circulating channels and the outward circulating channels are disposed alternately and separately.

To achieve the above objective, an electronic device of this invention comprises an electronic device body and an electronic element. A heat exchanging module is disposed to the electronic device body and comprises a casing, a plurality of first air guiding elements and a plurality of first separation elements. The first air guiding elements are disposed in the casing. Each of the first air guiding elements comprises a plurality of first structures and a plurality of second structures, the first structures are disposed parallelly, and the second structures are disposed between the first structures and connected with the first structures to form a plurality of first channels. Each of the first separation elements is disposed between the two adjacent first air guiding elements to form a second channel. An airflow direction of the first channels is different from that of the second channels. The electronic element is disposed in the electronic device body.

In one embodiment, the heat exchanging module further comprises a plurality of second air guiding elements and a plurality of second separation elements. Each of the second air guiding elements and each of the first separation elements are respectively disposed on two ends of the corresponding second channel. Each of the second air guiding elements comprises a plurality of first structures and a plurality of second structures, the first structures are disposed parallelly, and the second structures are disposed between the first structures and connected with the first structures to form a plurality of third channels. Each of the second separation elements is disposed between the two adjacent second air guiding elements to form a fourth channel.

In one embodiment, the first channels and the fourth channels communicate with each other to form a plurality of inward circulating channels (or outward circulating channels), respectively, the third channels and the second channels communicate with each other to form a plurality of outward circulating channels (or inward circulating channels), respectively, and the inward circulating channels and the outward circulating channels are disposed alternately and separately.

In one embodiment, the heat exchanging module further comprises a plurality of second separation elements. Each of the second separation elements is disposed between the two adjacent first air guiding elements, and each of the second separation elements and each of the first separation elements are respectively disposed on two ends of the corresponding second channel.

In one embodiment, the first channels have identical airflow direction, the second channels have identical airflow direction, and the airflow direction of the first channels is different from that of the second channels.

In one embodiment, the first channels and the second channels are inward circulating channels and outward circulating channels respectively or outward circulating channels and inward circulating channels respectively, and the inward circulating channels and the outward circulating channels are disposed alternately and separately.

As mentioned above, in the heat exchanging module and the electronic device applying the same according to the invention, the components of two kinds of the structure, i.e. the first air guiding element and the first separation element, are used in the assembly, and the first air guiding element and the first separation element can be disposed alternately and adhere to each other on a plane, so they can be stacked rapidly and orderly to form the structure of a heat dissipating core. In comparison with the conventional art where the heat dissipating core needs to be bent and stacked by a particular machine or formed by a stamping process to result in the higher cost, a lot of manufacturing time and complicated process, this invention can enhance the yield of the heat exchanging module by the simple structure and design.

Besides, the first air guiding element composed of two first structures and a plurality of second structures is formed into the structure similar to the corrugate. Thereby, the heat exchanging module can be formed into a track-like structure so as to possess a stronger rigidity and inflexibility. Accordingly, the lifespan of the heat exchanging module can be increased, and the heat exchanging performance thereof also can be enhanced under a stable and uneasy to be deformed structure base.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
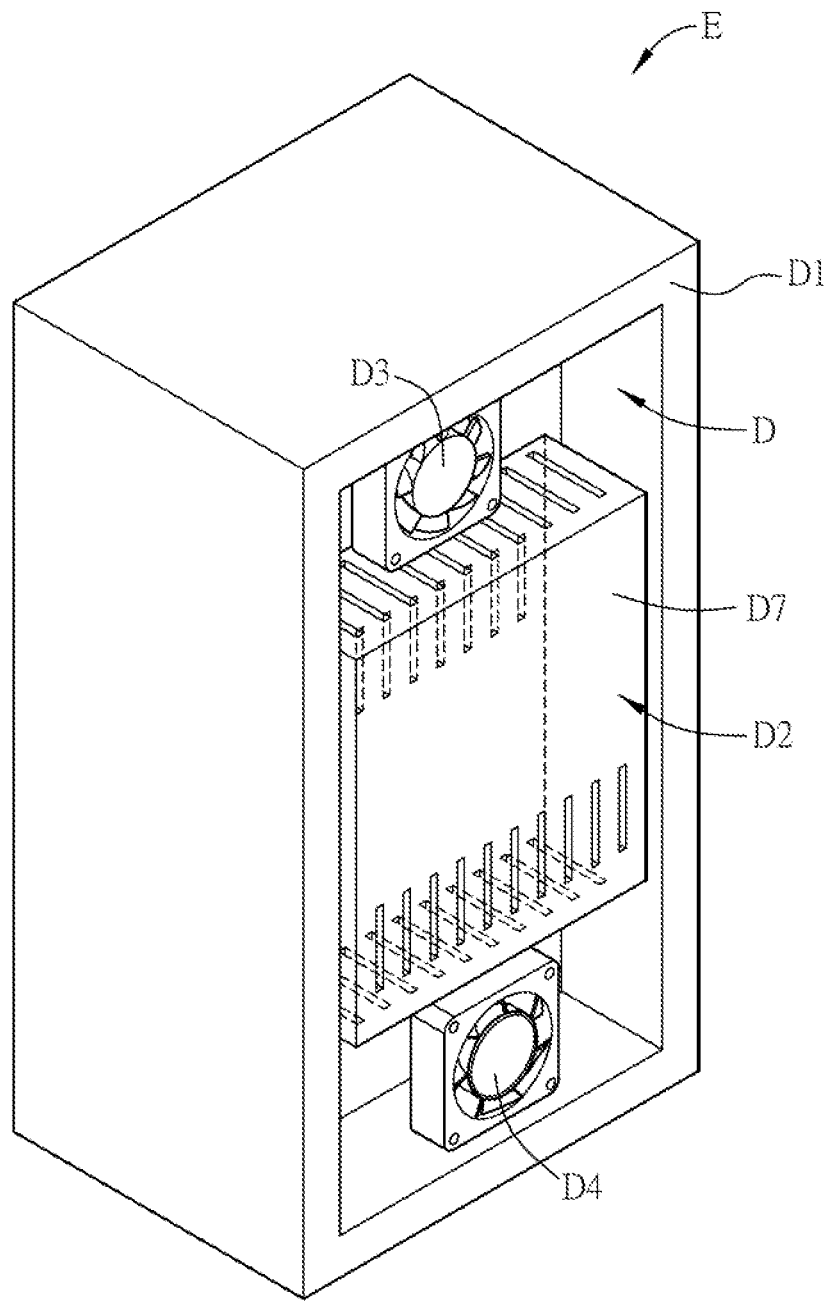
FIG. 1A is a schematic perspective diagram of a conventional heat exchanging device.
Figure 1B:
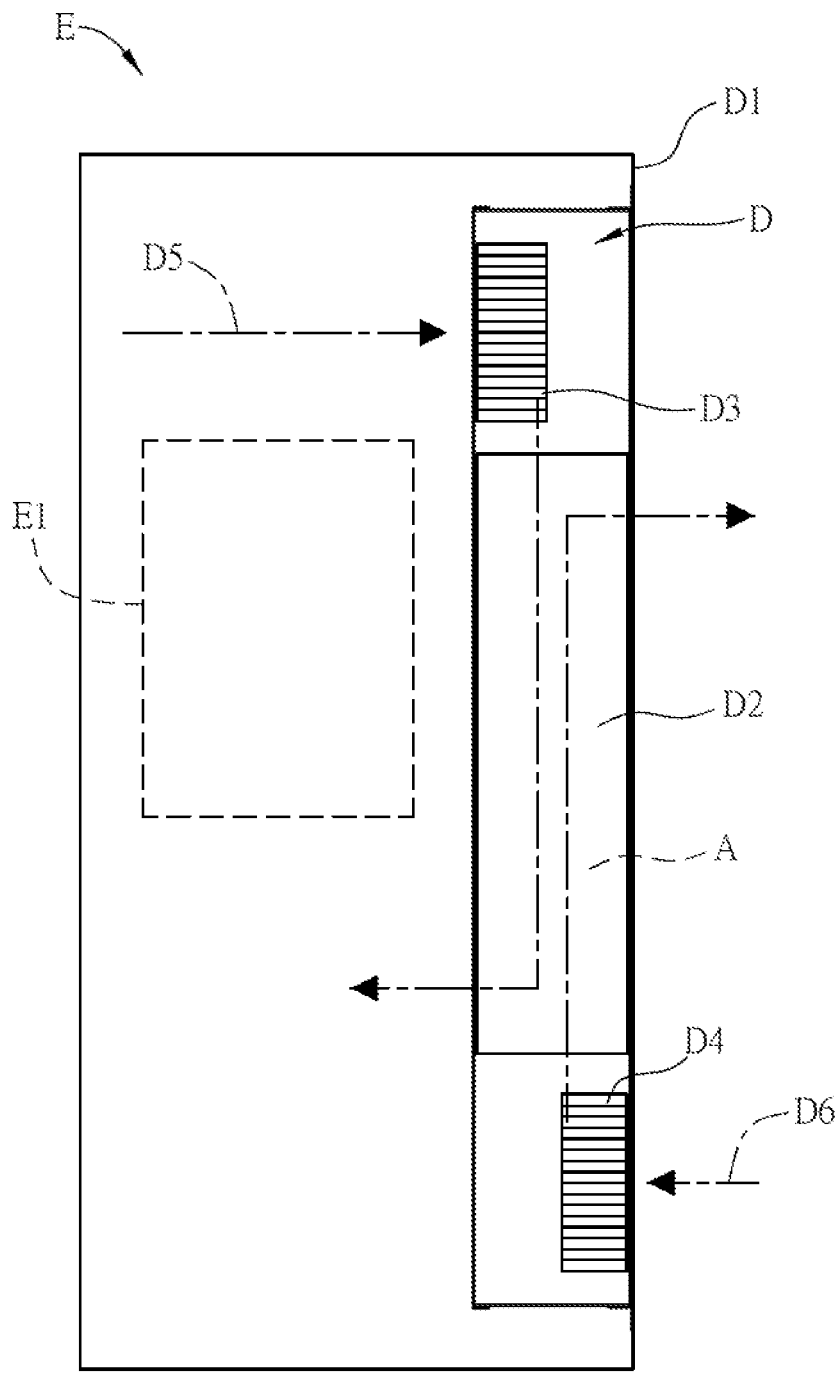
FIG. 1B is a schematic side view showing the airflow path of the heat exchanging device in FIG. 1A.
Figure 1C:
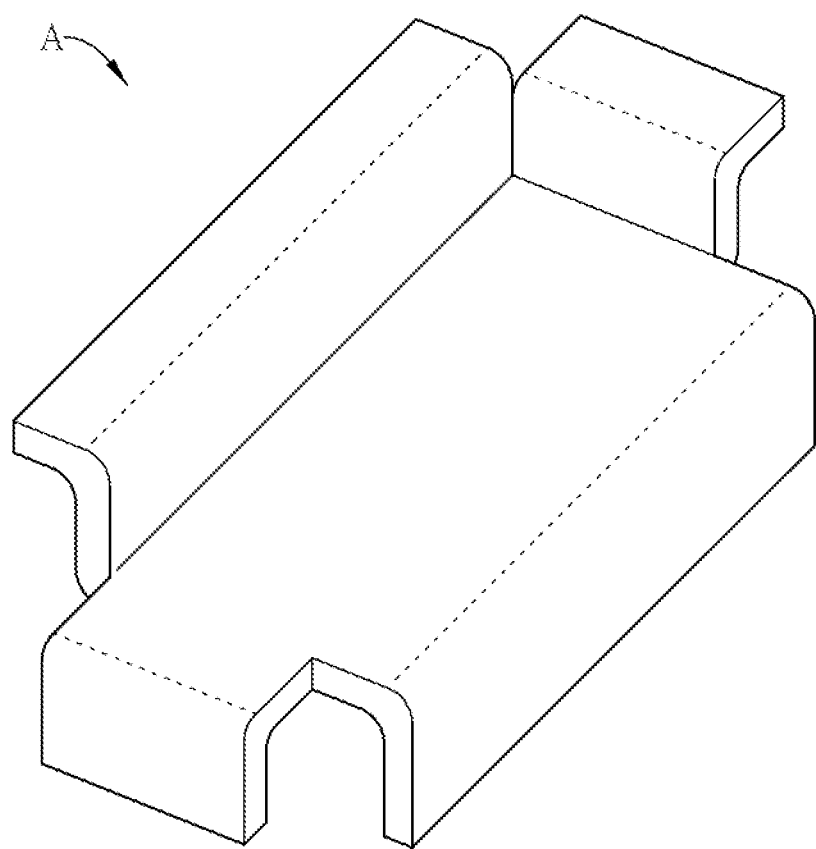
FIG. 1C is a schematic enlarged diagram of the heat dissipating aluminum sheets of the heat exchanging device in FIG. 1A.
Figure 2A:
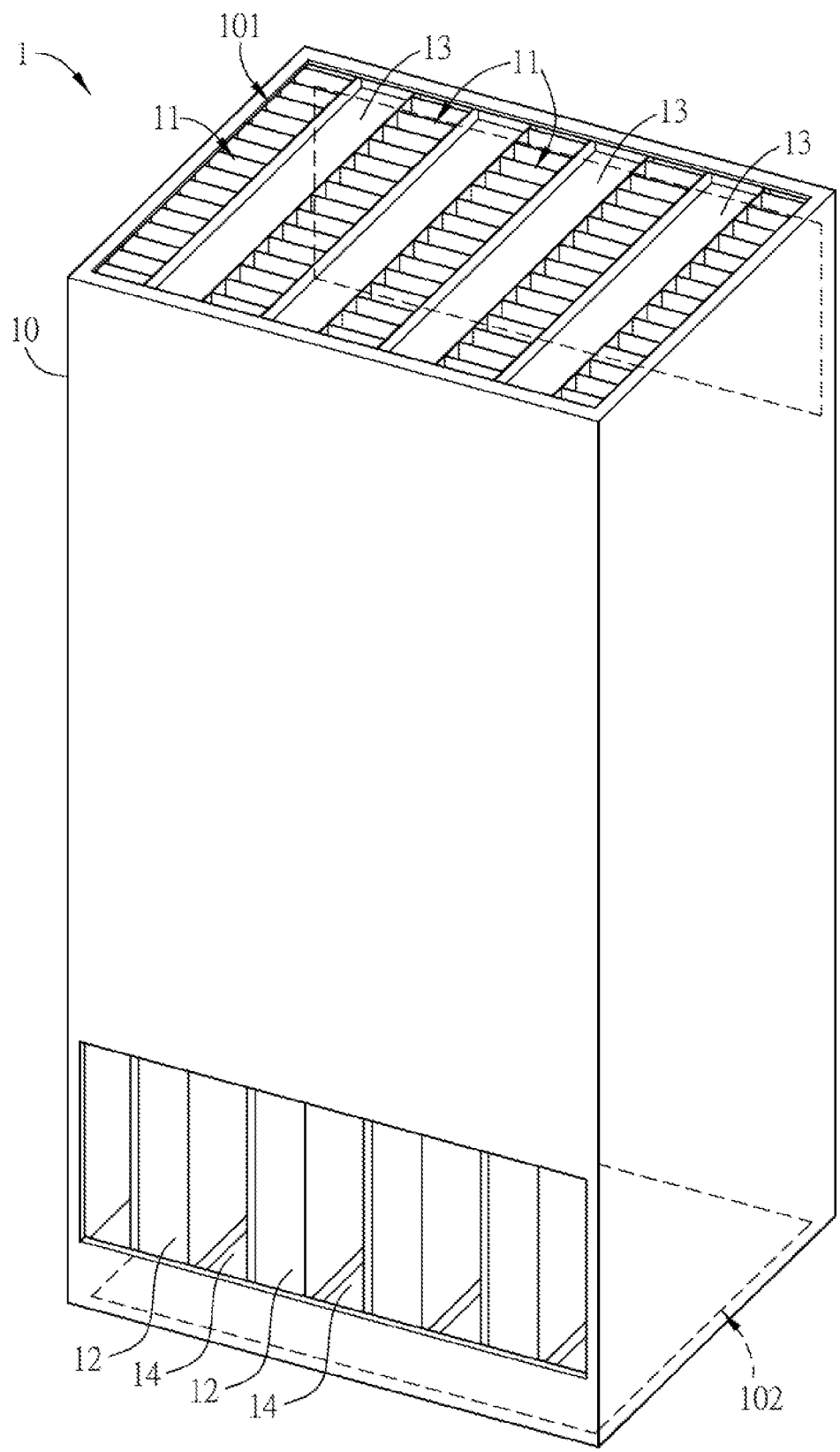
FIG. 2A is a schematic diagram of a heat exchanging module of an embodiment of the invention.
Figure 2B:
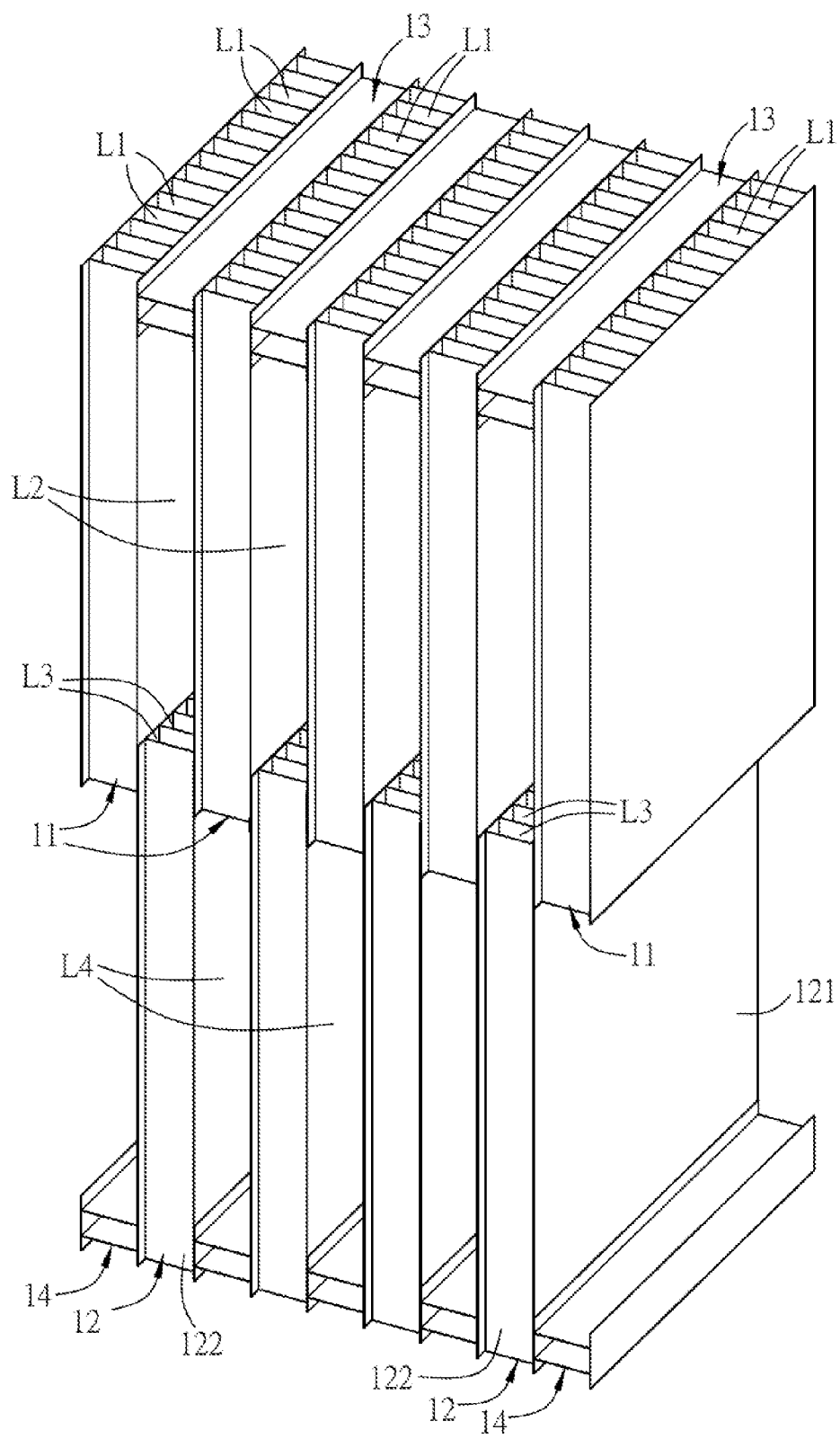
FIG. 2B is a schematic diagram showing a part of the heat exchanging module in FIG. 2A.
Figure 2C:
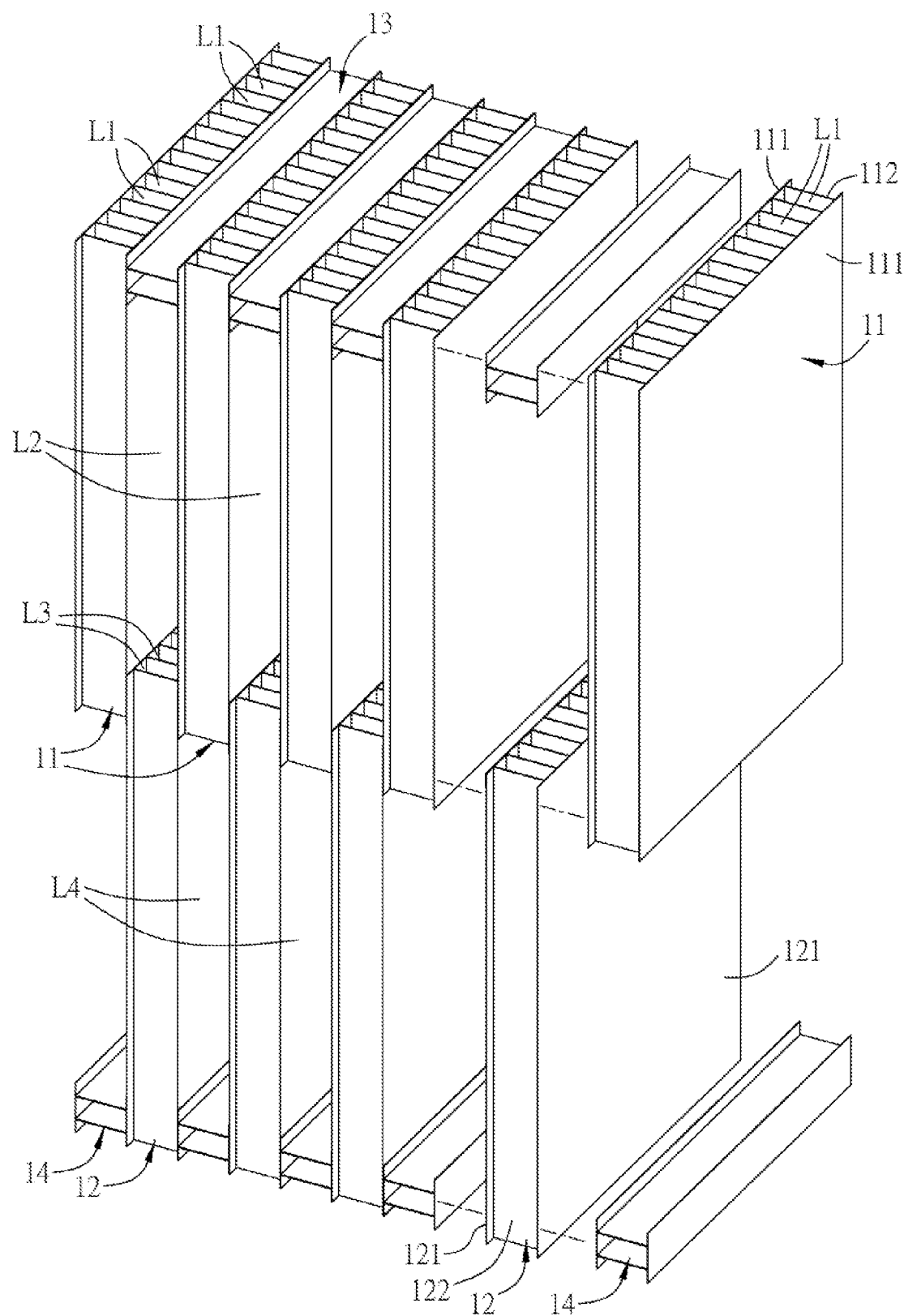
FIG. 2C is a schematic exploded diagram of a part of the heat exchanging module in FIG. 2A.

FIG. 2A is a schematic diagram of a heat exchanging module of an embodiment of the invention, FIG. 2B is a schematic diagram showing a part of the heat exchanging module in FIG. 2A, and FIG. 2C is a schematic exploded diagram of a part of the heat exchanging module in FIG. 2A. As shown in FIGS. 2A to 2C, the heat exchanging module 1 includes a casing 10, a plurality of first air guiding elements 11, a plurality of second air guiding elements 12, a plurality of first separation elements 13 and a plurality of second separation elements 14, and the first air guiding elements 11, the second air guiding elements 12, the first separation elements 13 and the second separation elements 14 are disposed in the casing 10. In this embodiment, the casing 10 is a cuboid structure including a first side 101 and a second side 102 which is opposite the first side 101, but this invention is not limited thereto. In practice, the casing 10 also can be a cube or varied according to the design of the heat exchanging module 1. In this embodiment, the material of the casing is not limited, which can be plastic or metal material in the application.

In order to clearly show the assembly and connection of the components except the casing 10, FIGS. 2B and 2C omit the casing 10 to show the components inside the casing 10. Herein, five first air guiding elements 11, four second air guiding elements 12, four first separation elements 13 and five second separation elements 14 are illustrated as an example. However, the above numbers are not limited in this invention and can be varied according to the volume of the electronic device using the heat exchanging module and according to the heat dissipating requirement. The structural features of the heat exchanging module 1 are illustrated as below.

As shown in FIGS. 2B and 2C, each of the first air guiding elements 11 includes two first structures 111 and a plurality of second structures 112. The first structures 111 of the first air guiding elements 11 are disposed parallelly, and the second structures 112 of the first air guiding element 11 are disposed between the two first structures 111 of the first air guiding element 11. Each of the second structures 112 is connected with the two first structures 111 of the first air guiding element 11. By the above structure, the two first structures 111 and the second structures 112 of each of the first air guiding elements 11 define a plurality of first channels L1.

Refer to FIGS. 2B and 2C, which show the relation between the first structures 111 and the second structures 112. In a single first air guiding element 11 of this embodiment, the first structure 111 and the second structure 112 are both a flat sheet structure, and the second structures 112 are disposed, favorably, perpendicular to the two first structures 111, so as to enhance the structural strength of each of the first air guiding elements along the stack direction. Of course, the included angle between the first structure 111 and the second structure 112 is not limited in this invention, and may be varied according to the process or use purpose in the practical manufacturing and application, but however this will not affect the air flowing effect within the first channel L1.

As shown in FIGS. 2A, 2B, 2C, the heat exchanging module 1 further includes a plurality of second air guiding elements 12, a plurality of first separation elements 13 and a plurality of second separation elements 14. Each of the first separation elements 13 is disposed between the two adjacent first air guiding elements 11, and each of the first separation elements 13 and the two adjacent first air guiding elements 11 define a second channel L2. Moreover, each of the second air guiding elements 12 and each of the first separation elements 13 are respectively disposed on two ends of the corresponding second channel L2. In other words, as a whole, the first separation elements 13 are disposed on the side of the second channel L2 closer to the first side 101 of the casing 10, and the second air guiding elements 12 are disposed on the side of the second channel L2 closer to the second side 102 of the casing 10.

The second air guiding element 12 substantially includes the same structure as the first air guiding element 11. Each of the second air guiding elements 12, likewise, includes two first structures 121 and a plurality of second structures 122, and the first structures 121 and the second structures 122 define a plurality of third channels L3. Since the second air guiding element 12 and the first air guiding element 11 substantially have the same structure and features, the related illustration is omitted here for conciseness.

As shown in FIGS. 2A, 2B, 2C, the second separation element 14 substantially includes the same structure as the first separation element 13, but each of the second separation elements 14 is disposed between the two adjacent second air guiding elements 12. Furthermore, each of the second separation elements 14 and the two adjacent second air guiding elements 12 define a fourth channel L4. In detail, the second separation element 14 is disposed opposite each of the first air guiding elements 11. In other words, as a whole, the second separation elements 14 are disposed on the side of the fourth channel L4 closer to the second side 102 of the casing 10, and the first air guiding elements 11 are disposed on the side of the fourth channel L4 closer to the first side 101 of the casing 10.

By the above structure, the first channels L1 and the corresponding fourth channel L4 communicate with each other to define a plurality of inward circulating channels (or outward circulating channels), and the third channels L3 and the corresponding second channel L2 communicate with each other to define a plurality of outward circulating channels (or inward circulating channels). Herein for example, the combination of the first channels L1 and the corresponding fourth channel L4 forms a plurality of inward circulating channels, and the combination of the third channels L3 and the corresponding second channel L2 forms a plurality of outward circulating channels, and the inward circulating channels and the outward circulating channels are disposed alternately and separately so as to bring the heat exchanging effect. The heat exchanging process will be illustrated later with the structure of the casing 10.

To be noted, the first air guiding elements 11, the second air guiding elements 12, the first separation elements 13 and the second separation elements 14 are all the structure similar to the corrugate. Besides, each of the first air guiding elements 11, the second air guiding elements 12, the first separation elements 13 or the second separation elements 14 is, favorably, integrally formed by the plastic or metal material, or is formed by the plastic material and the metal material, or the material with high heat dissipating performance. In this embodiment, the first air guiding elements 11, the second air guiding elements 12, the first separation elements 13 and the second separation elements 14 are formed by a cutting method and then connected together through the planar portions thereof by the glue, hot melt or ultrasonic welding. In comparison with the conventional art where the heat exchanging module (heat dissipating core) needs to be bent and stacked by a particular machine or formed by a stamping process so as to result in the higher cost and complicated process, this invention makes the planar portions connected together and thus can achieve the ordered and rapid stack and connection.

Figure 2D:
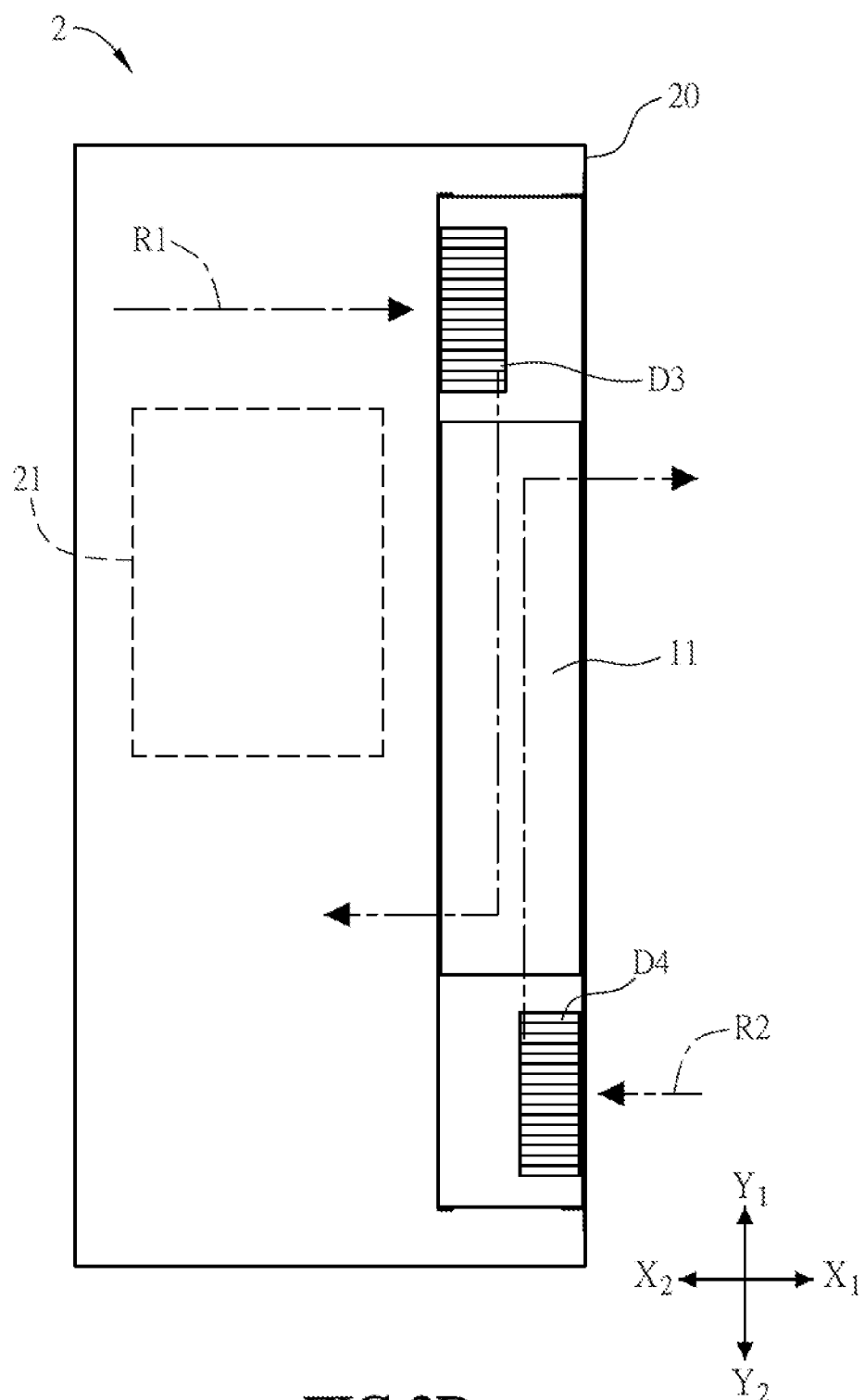
FIG. 2D is a schematic diagram showing the situation of that the heat exchanging module in FIG. 2A is applied to an electronic device.
Figure 2E:
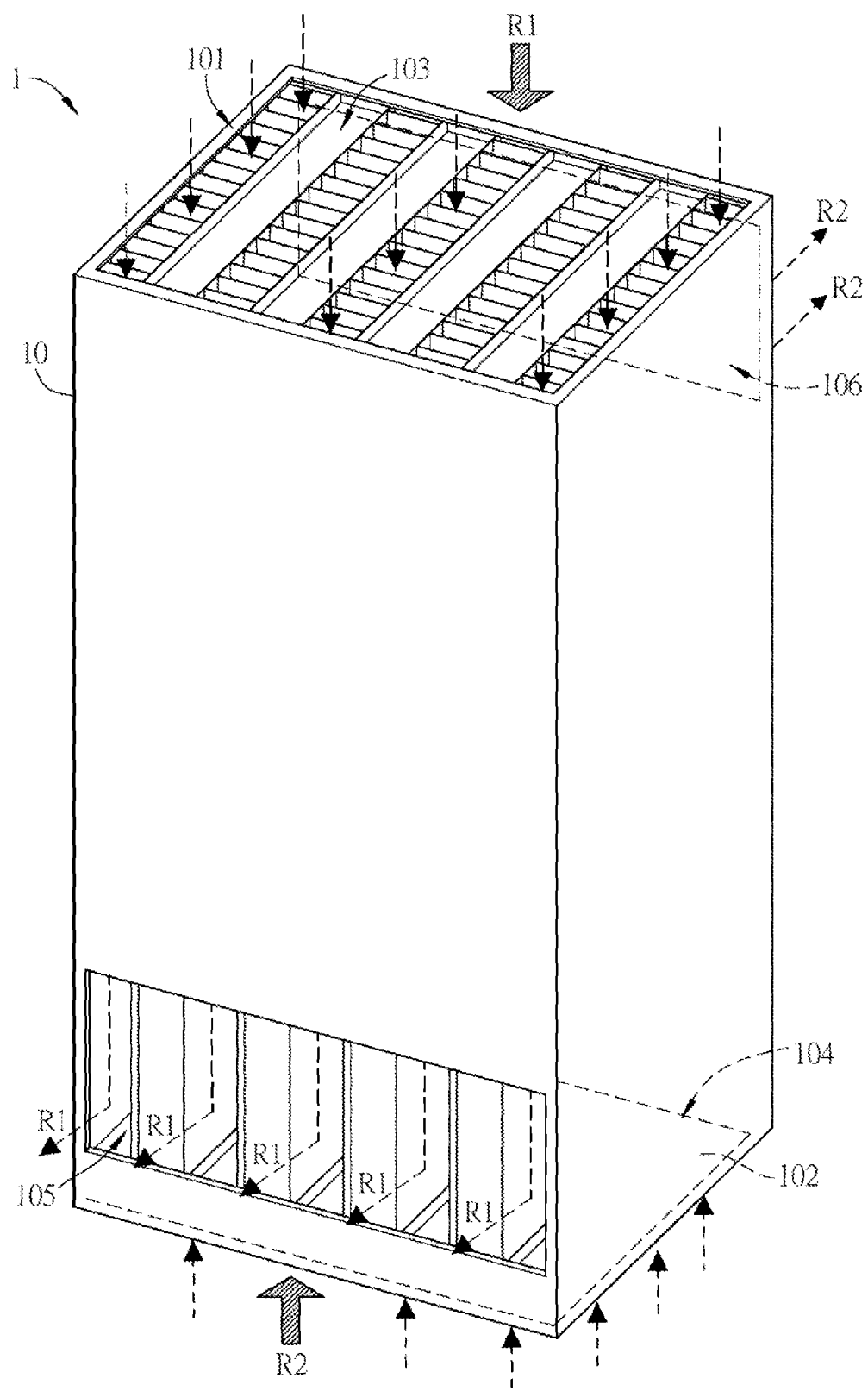
FIG. 2E is a schematic diagram showing the airflow direction of the heat exchanging module in FIG. 2A.
Figure 2F:
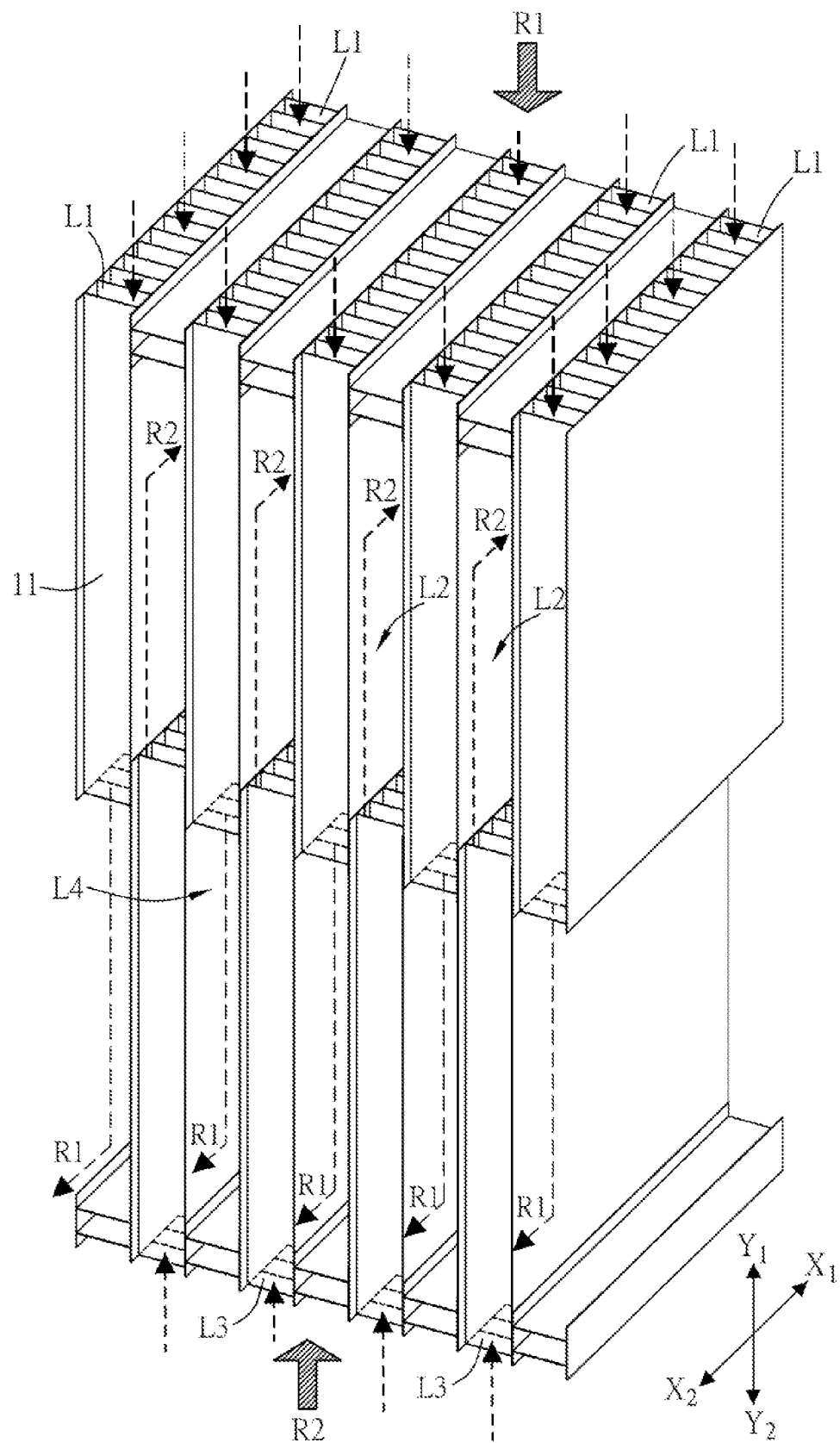
FIG. 2F is a schematic exploded diagram of a part of the heat exchanging module in FIG. 2A.

FIG. 2D is a schematic diagram showing the situation of that the heat exchanging module in FIG. 2A is applied to an electronic device, FIG. 2E is a schematic diagram showing the airflow direction of the heat exchanging module in FIG. 2A, and FIG. 2F is a schematic exploded diagram of a part of the heat exchanging module in FIG. 2A. This embodiment uses the situation and diagram obtained by simulating that the heat exchanging module 1 is applied to an electronic device 2 to illustrate the airflow direction and the heat exchanging mechanism of the heat exchanging module and how to dissipate the heat of the electronic device 2 by the heat exchanging module 1.

As shown in FIGS. 2D, 2E and 2F, the heat exchanging module 1 is covered by the electronic device body 20 so as to be insulated from the external environment and form the channels for the airflow circulation. The first fan D3 is disposed on the inward circulating path R1 to drive the inward circulating airflow, and that means the hot airflow generated by the operation of the electronic element 21 of the electronic device 2 is guided from a side of the electronic device body 20 and along the inward circulating path R1 to enter into the heat exchanging module 1. Meanwhile the second fan D4 is disposed on the outward circulating path R2 to drive the outward circulating airflow, and that means the cold airflow outside the electronic device 2 is guided from the other side of the electronic device body 20 and along the outward circulating path R2 to flow into the heat exchanging module 1. Accordingly, in the region where the inward circulating path R1 and the outward circulating path R2 are disposed adjacent to each other, the heat exchanging effect can be provided between the inward circulating airflow of relative higher temperature and the outward circulating airflow of relative lower temperature, so as to reduce the temperature of the inward circulating airflow and supply the inward circulating airflow to the electronic element 21 of the electronic device 2. Thereby, the effect of reducing the temperature inside the electronic device 2 can be achieved.

The heat exchanging manner of the heat exchanging module 1 of this embodiment is illustrated as below. As shown in FIGS. 2D, 2E, 2F, in this embodiment, in consideration of the airflow direction, the casing 10 includes a first opening 103 on the first side 101, a second opening 104 on the second side 102, and a third opening 105 and a fourth opening 106 which are respectively disposed on the two sides adjacent to the first side 101 and the second side 102.

In this embodiment, as to the inward circulating path R1, the hot airflow coming from the inside of the electronic device flows through the first fan D3 and along the direction X1 to enter, then flows into the first channels L1 through the first opening 103 and along the direction Y2, then flows along the direction Y2 and into the fourth channels L correspondingly communicating with the first channels L1, and last flows back to the inside of the electronic device through the third opening 105 of the casing along the direction X2. As to the outward circulating path R2, the cold airflow coming from the outside of the electronic device flows through the guidance of the second fan D4 and along the direction X2 to enter, then flows into the third channels L3 through the second opening 104 of the casing 10 and along the direction Y1, then flows along the direction Y1 and into the second channels L2 corresponding communicating with the third channels L3, and last leaves the electronic device through the fourth opening 106 of the casing and along the direction X1. The direction X1 is opposite the direction X2, the direction Y1 is opposite the direction Y2, and the directions X1, X2 are perpendicular to the directions Y1, Y2. In other words, the inward circulating path R1 comprises the flows of the directions Y2 and X2 in the fourth channel L4, and the outward circulating path R2 comprises the flows of the directions Y1 and X1 in the second channels L2.

As a whole, the airflows entering through the first opening 103 and the second opening 104 can averagely flow to the first channels L1 and the second channels L3, respectively. Since the inward circulating path R1 and the outward circulating path R2 are disposed alternately in the casing 10, the adjacent layers belong to different circulating layers and the airflow directions of the adjacent layers are opposite to each other (exhibiting an included angle of 180° in a projection direction). Meanwhile, the cold air introduced by the outward circulating path R2 will undergo a heat exchange with the hot air introduced by the inward circulating path R1, so that the air on the outward circulating path R2 can take the heat away in a heat conduction manner to achieve the heat dissipating effect. Through the design of the insulated channels of the heat exchanging module 1, the heat dissipating performance can be enhanced considerably by the opposite circulations.

Figure 3A:
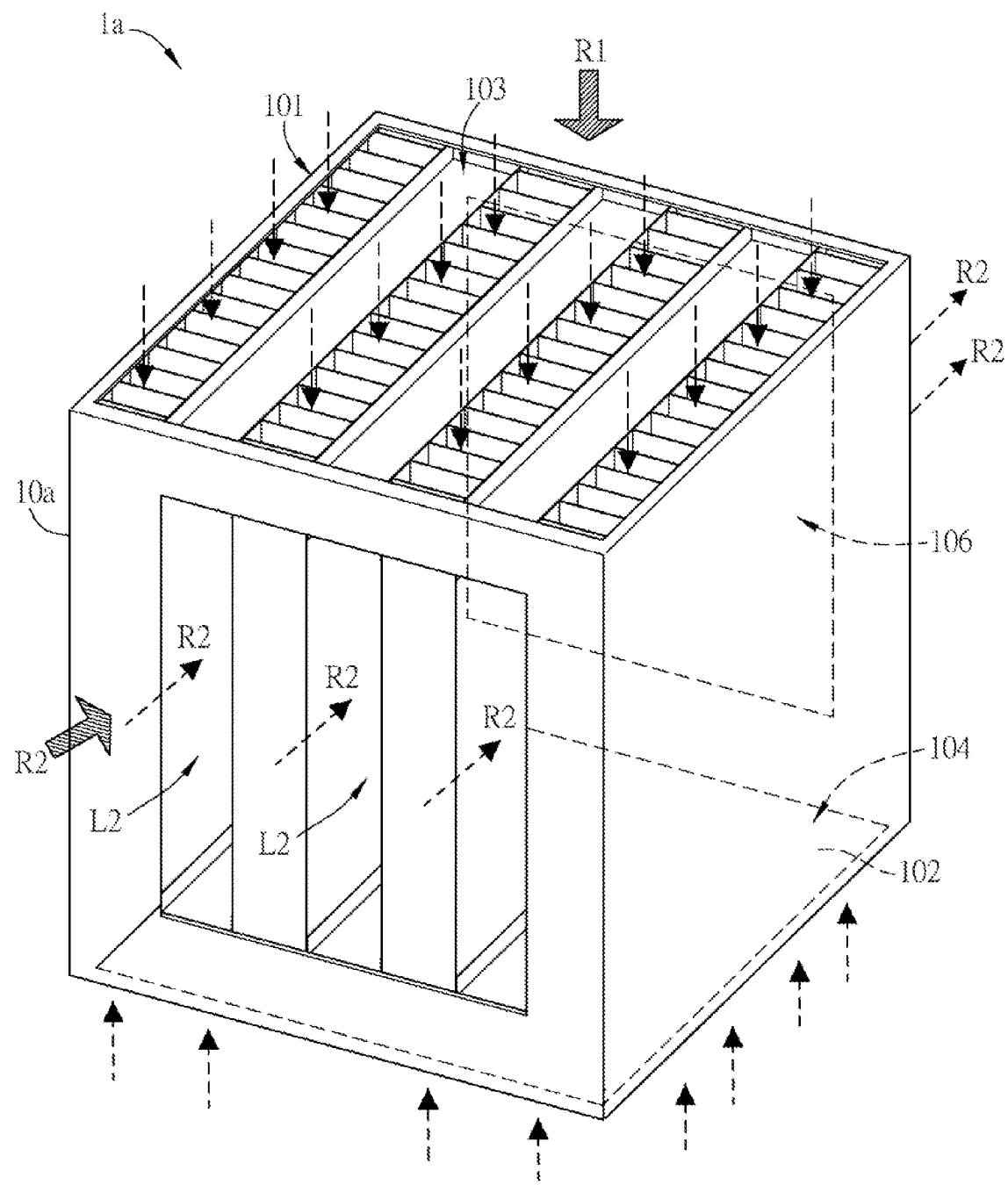
FIG. 3A is a schematic diagram of a heat exchanging module of another embodiment of the invention.
Figure 3B:
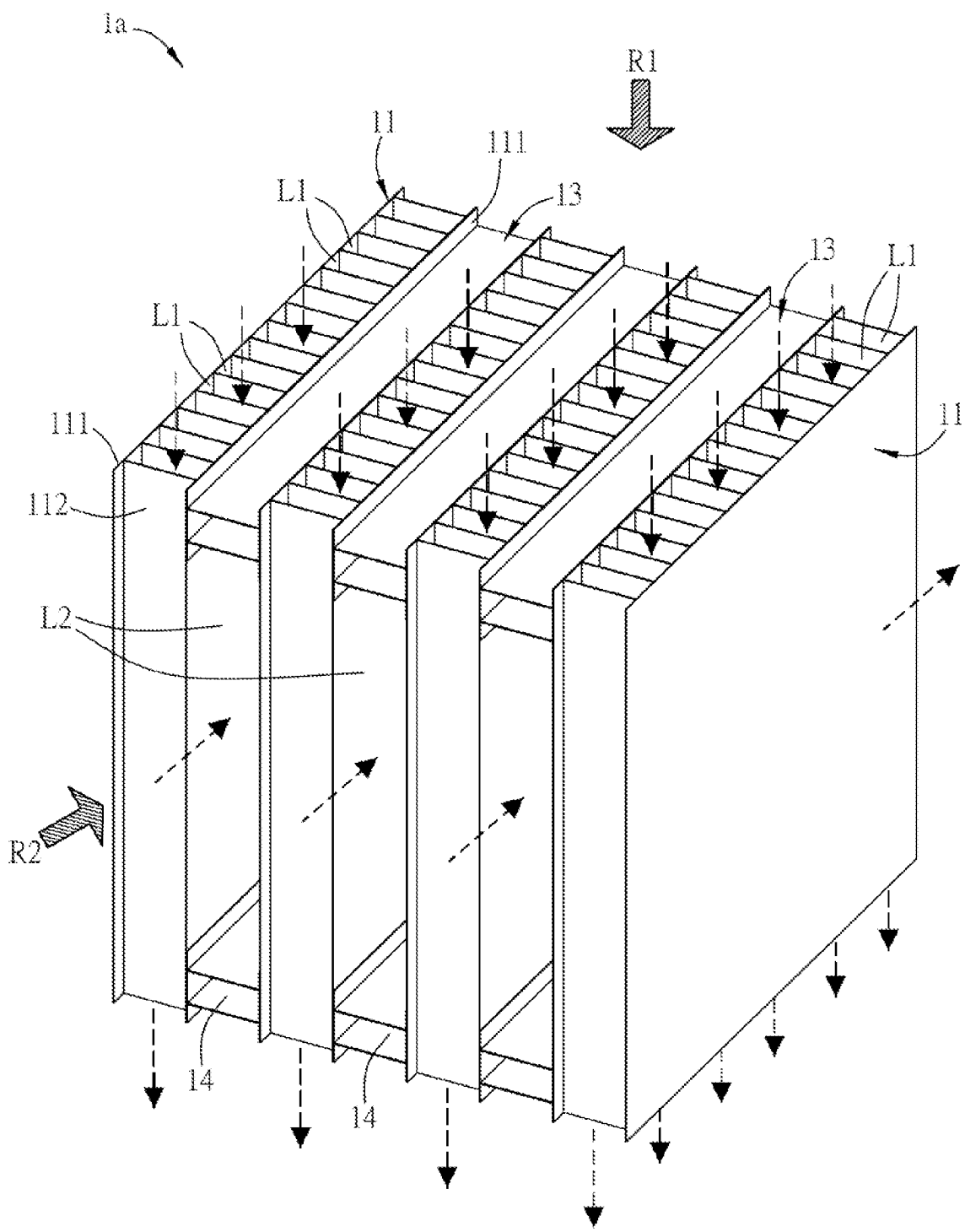
FIG. 3B is a schematic diagram showing a part of the heat exchanging module in FIG. 3A.
Figure 3C:
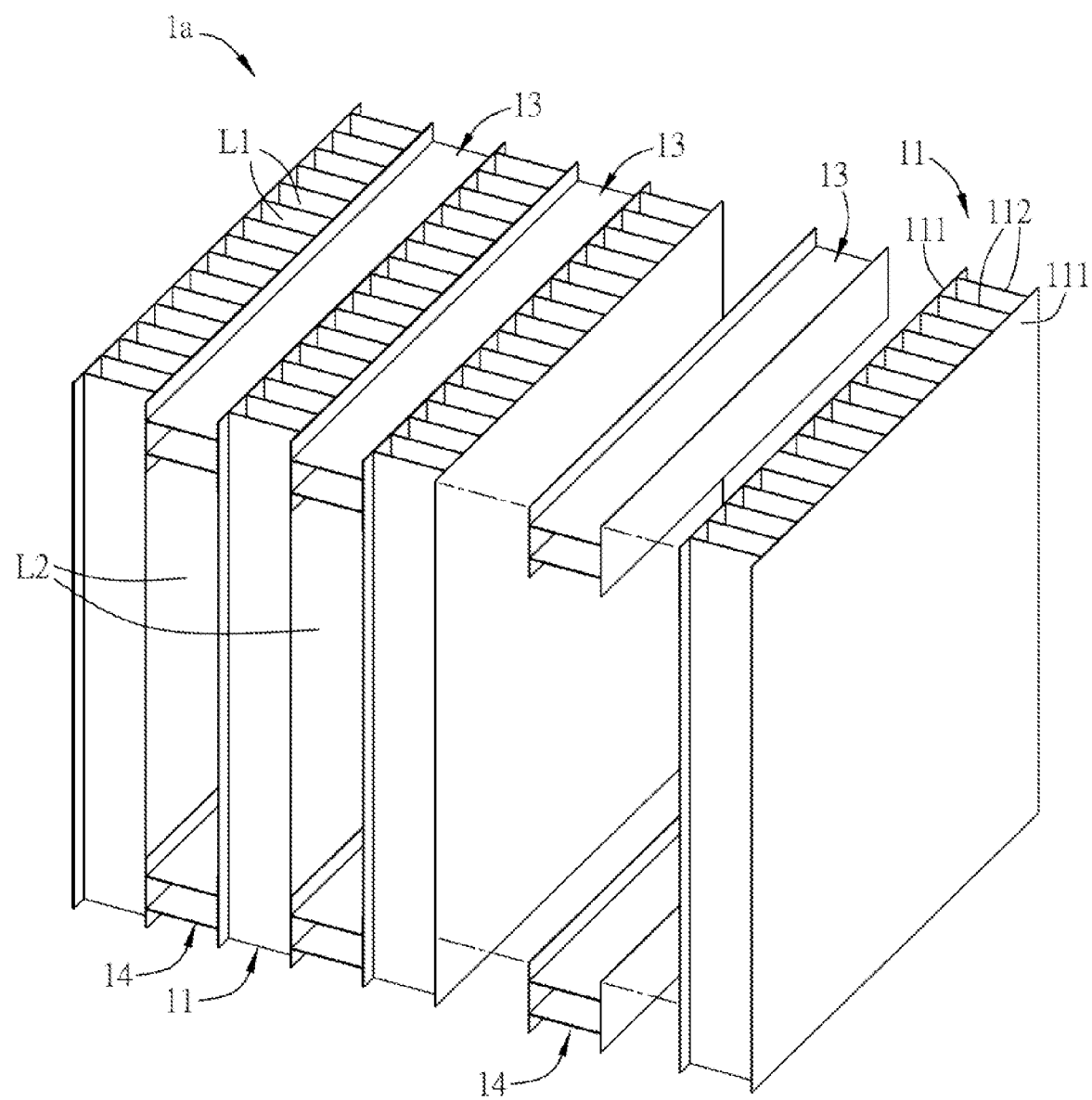
FIG. 3C is a schematic exploded diagram of a part of the heat exchanging module in FIG. 3A.

FIG. 3A is a schematic diagram of a heat exchanging module of another embodiment of the invention, FIG. 3B is a schematic diagram showing a part of the heat exchanging module in FIG. 3A, and FIG. 3C is a schematic exploded diagram of a part of the heat exchanging module in FIG. 3A. As shown in FIGS. 3A to 3C, the heat exchanging module 1a substantially includes the same structure and features as the heat exchanging module 1 of the above embodiment. However, the heat exchanging module 1a is composed of a casing 10a, a plurality of first air guiding elements 11, a plurality of first separation elements 13 and a plurality of second separation elements 14, and the first air guiding elements 11, the first separation elements 13 and the second separation elements 14 are disposed in the casing 10a. Moreover, the first air guiding element 11 as mentioned here substantially includes the same structure as the second air guiding element 12 as mentioned in the above embodiment, and the first separation element 13 and the second separation element 14 substantially include the same structure so they can be replaced by each other.

In detail, the first structures 111 of the first air guiding elements 11 of the heat exchanging module 1a are disposed parallelly, and the second structures 112 of the corresponding first air guiding element 11 are disposed between the two first structures 111 of the corresponding first air guiding element 11. Each of the second structures 112 is connected with the two first structures 111 of the first air guiding element 11. By the above structure, the two first structures 111 and the second structures 112 of the corresponding first air guiding element 11 define a plurality of first channels L1.

Each of the first separation elements 13 and each of the second separation elements 14 are disposed between the adjacent two first air guiding elements 11 to define a second channel L2. As a whole, the first air guiding element 11 (and the first channels L1 defined thereby) is disposed adjacent to and separate from the corresponding second channel L2. In other words, each of the second channels L2 is disposed between two of the first air guiding elements 11. Herein for example, the first channels L1 are used as a part of the inward circulating path R1 and the second channels L2 are used as a part of the outward circulating path R2. However, this invention is not limited thereto, and the position and direction of the first channel L1 and the second channel L2 can be adjusted according to the heat dissipating requirement in the practical application.

Figure 3D:
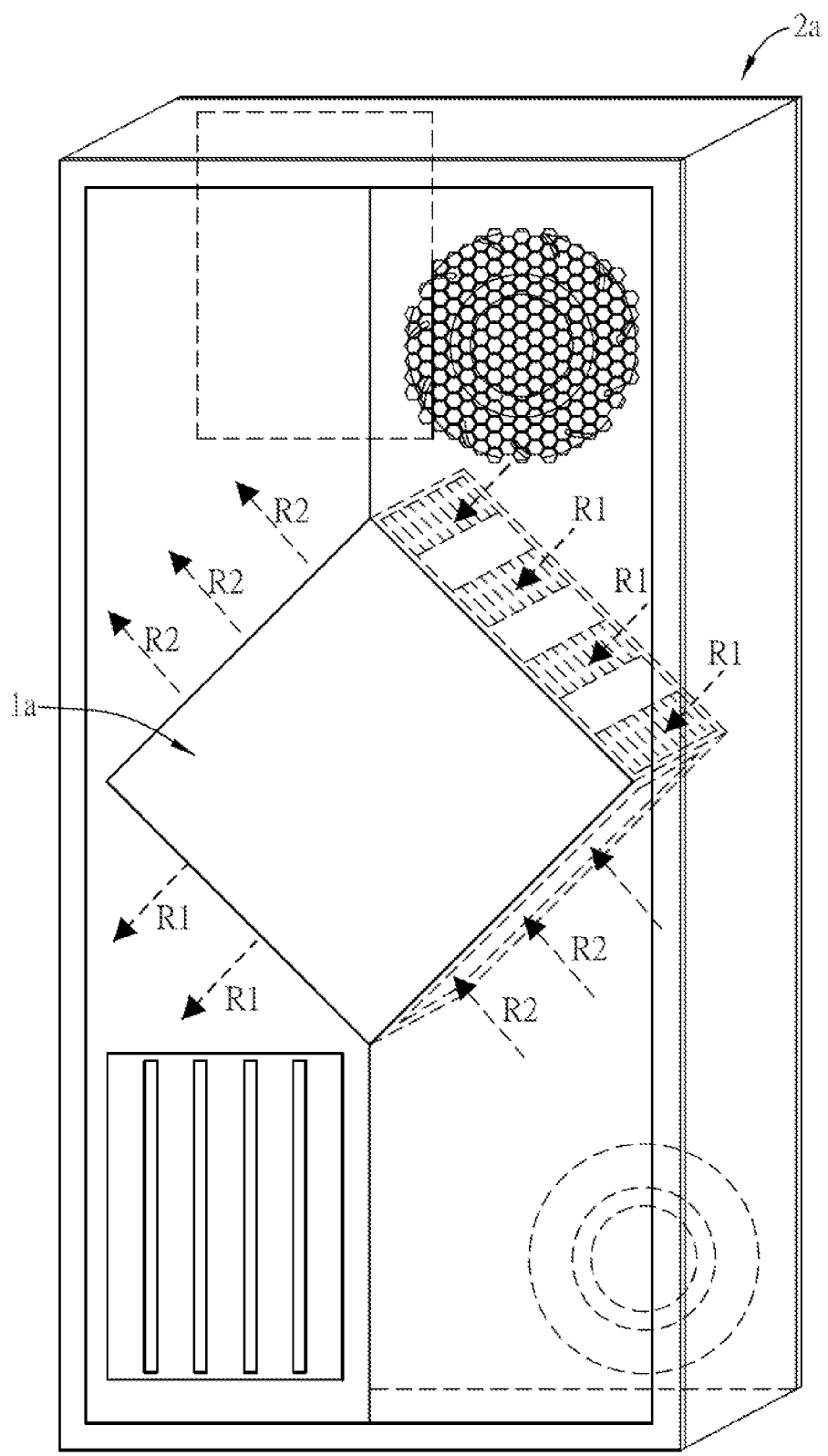
FIG. 3D is a schematic diagram showing the situation obtained by simulating that the heat exchanging module in FIG. 3A is applied to an electronic device.

The main difference from the heat exchanging module 1 of the above embodiment is that the airflow directions of the adjacent layers of the heat exchanging module 1a of this embodiment form an included angle of 90° in a projection direction. When the heat exchanging module 1a is disposed in the electronic device 2a in an application (as shown in FIG. 3D), the inward circulating path R1 and the outward circulating path R2 can be disposed as a cross type, so as to save the space required for the disposition of the heat exchanging module. Therefore, the heat exchanging module 1a can be applied to an electronic device of a smaller size.

The airflow direction and the heat exchanging mechanism of the heat exchanging module 1a are illustrated as below. The hot airflow generated by the electronic device (not shown) flows into the heat exchanging module 1a through the inward circulating path R1, and meanwhile, the cold airflow coming from the outside of the electronic device flows into the heat exchanging module 1a through the outward circulating path R2. Accordingly, in the region where the inward circulating path R1 and the outward circulating path R2 are disposed adjacent to each other, the heat exchanging effect can be provided between the inward circulating airflow of relative higher temperature and the outward circulating airflow of relative lower temperature, so as to reduce the temperature of the inward circulating airflow and supply the inward circulating airflow to the inside of the electronic device. Thereby, the effect of reducing the temperature inside the electronic device can be achieved.

Figure 4A:
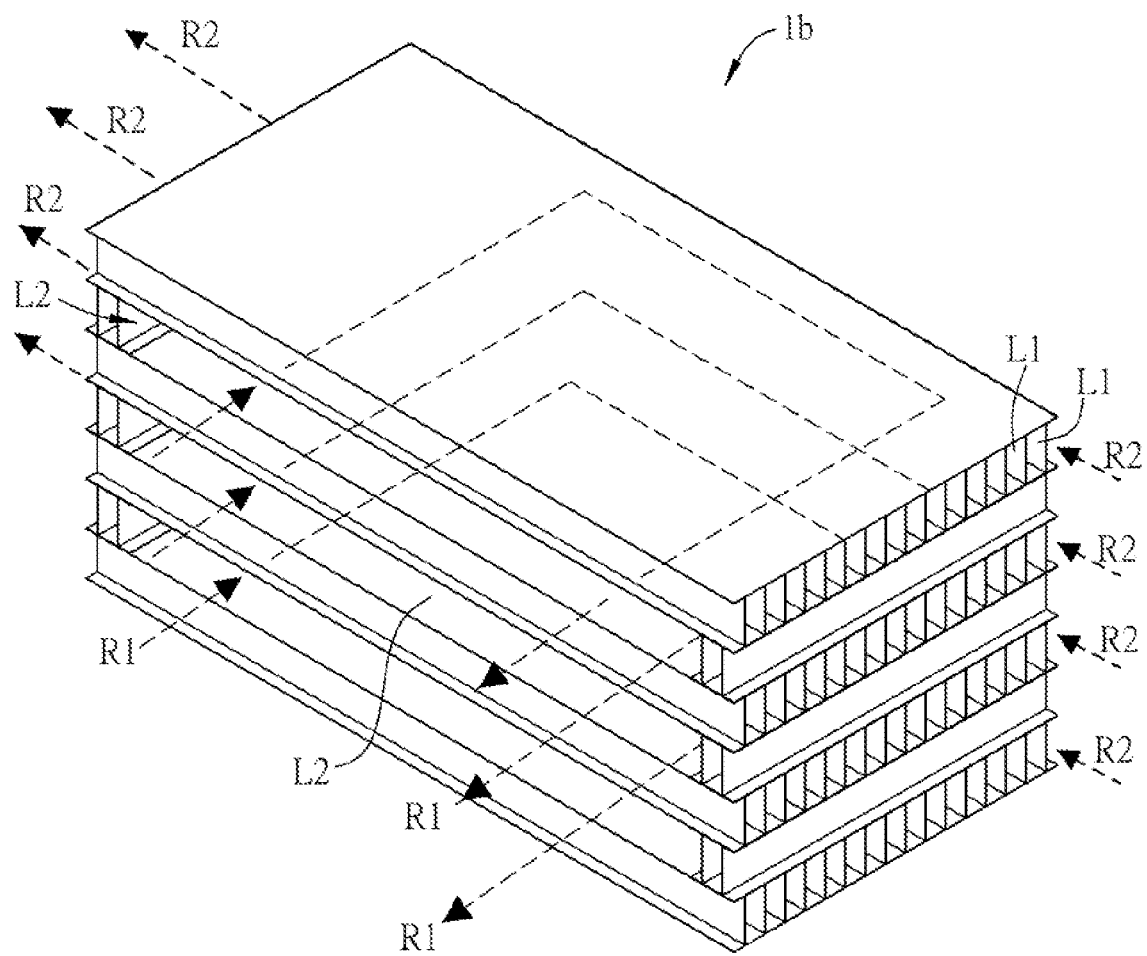
FIG. 4A is a schematic diagram of a heat exchanging module of another embodiment of the invention.
Figure 4B:
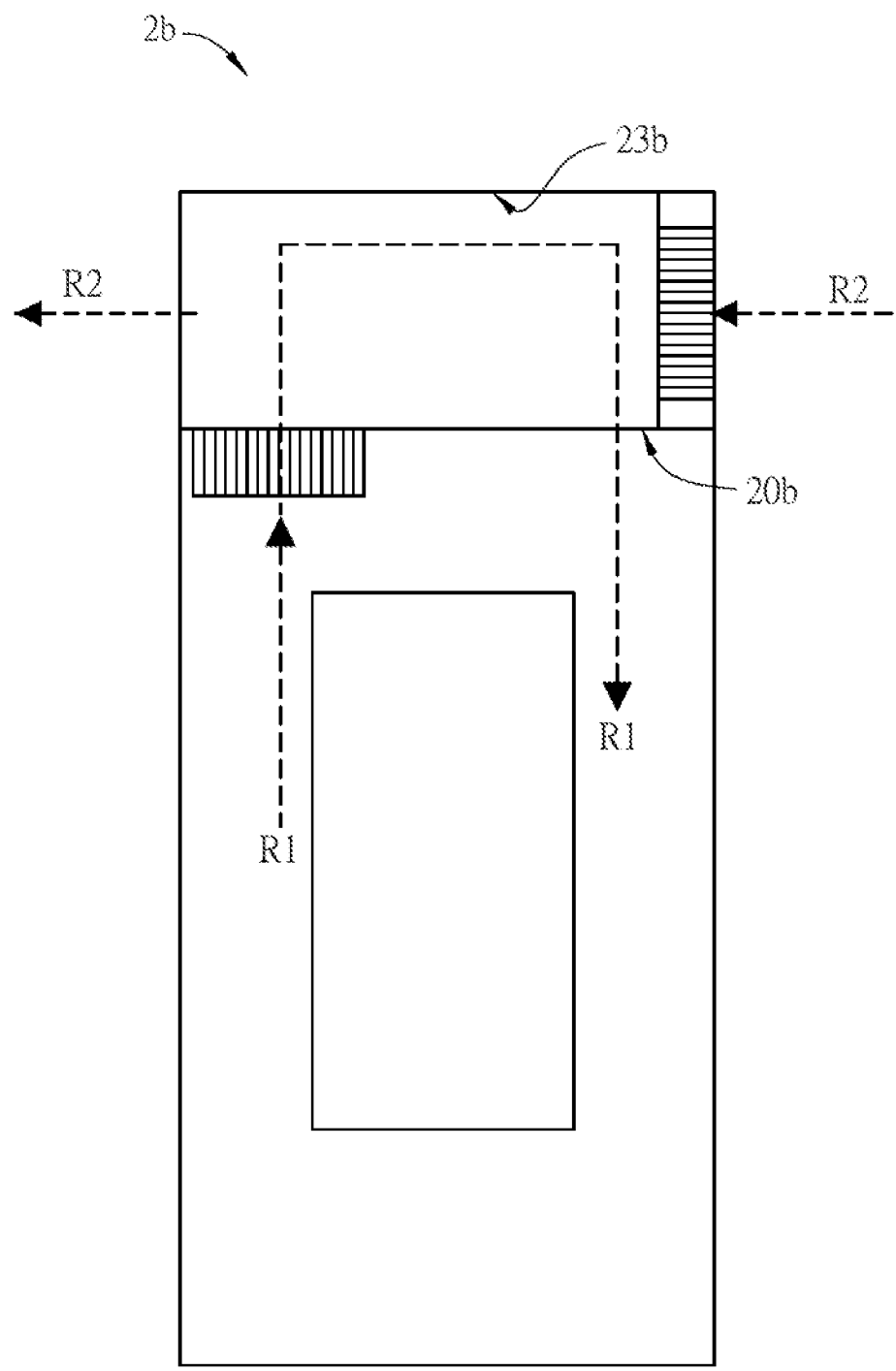
FIG. 4B is a schematic diagram showing the situation of that the heat exchanging module in FIG. 4A is applied to an electronic device.

FIG. 4A is a schematic diagram of a heat exchanging module of another embodiment of the invention, and FIG. 4B is a schematic diagram showing the situation of that the heat exchanging module in FIG. 4A is applied to an electronic device. As shown in FIGS. 4A and 4B, the heat exchanging module 1b substantially includes the same structure and features as the heat exchanging module 1a of the above embodiment, but the heat exchanging module 1b is applied to the top portion of the electronic device 2b, i.e. an overhead type disposition.

In detail, in the heat exchanging module 1b of this embodiment, a plurality of first channels L1 are used to communicate with the electronic device 2b so as to act as a part of the outward circulating path R2, and one end of each of the second channels L2 contacts an inner wall 23b of the electronic device body 20b of the electronic device 2b so that each of the second channels L2 just has the opening on a single side. When the hot airflow coming from the inside of the electronic device 2b flows into the second channel L2, the hot airflow will be guided by the inner wall 23b and then flow along the structure of the second channel L2 and last flow out of the heat exchanging module 1b. As a whole, in the region where the inward circulating path R1 and the outward circulating path R2 are disposed adjacent to each other, the heat exchanging effect can be provided between the inward circulating airflow of relative higher temperature and the outward circulating airflow of relative lower temperature, so as to reduce the temperature of the inward circulating airflow and supply the inward circulating airflow to the inside of the electronic device 2b. Thereby, the effect of reducing the temperature inside the electronic device 2b can be achieved.

This invention also provides an electronic device using the above-mentioned heat exchanging module 1, 1a, 1b. Since the structures of the heat exchanging module and the electronic device are all clearly illustrated in the above description, the related illustrations are omitted here for conciseness.

Summarily, in the heat exchanging module and the electronic device applying the same according to the invention, the components of two kinds of the structure, i.e. the first air guiding element and the first separation element, are used in the assembly, and the first air guiding element and the first separation element can be disposed alternately and adhere to each other on a plane, so they can be stacked rapidly and orderly to form the structure of a heat dissipating core. In comparison with the conventional art where the heat dissipating core needs to be bent and stacked by a particular machine or formed by a stamping process to result in the higher cost, a lot of manufacturing time and complicated process, this invention can enhance the yield of the heat exchanging module by the simple structure and design.

Besides, the first air guiding element composed of two first structures and a plurality of second structures is formed into the structure similar to the corrugate. Thereby, the heat exchanging module can be formed into a track-like structure so as to possess a stronger rigidity and inflexibility. Accordingly, the lifespan of the heat exchanging module can be increased, and the heat exchanging performance thereof also can be enhanced under a stable and uneasy to be deformed structure base.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat exchanging module, comprising:
   a casing;
   a plurality of first air guiding elements disposed in the casing, wherein each of the first air guiding elements comprises a plurality of first structures and a plurality of second structures, the first structures are disposed parallelly, and the second structures are disposed between the first structures and connected with the first structures to form a plurality of first channels;
   a plurality of first separation elements, wherein each of the first separation elements is disposed between the two adjacent first air guiding elements; and
   a plurality of second separation elements, wherein each of the second separation elements are disposed between the adjacent two first air guiding elements, and the first separation elements and the second separation elements are respectively disposed along two opposite edges of the corresponding two first air guiding elements to form a plurality of second channels, and an airflow direction of the first channels is different from that of the second channels, wherein the airflow direction of the first channels is toward a constant direction, and the airflow direction of the first channels and the airflow direction of the second channels form an included angle of 90° in a projection direction.

2. The heat exchanging module as recited in claim 1, wherein the first channels have identical airflow direction, and the second channels have identical airflow direction.

3. The heat exchanging module as recited in claim 1, wherein the first channels and the second channels are inward circulating channels and outward circulating channels respectively or outward circulating channels and inward circulating channels respectively, and the inward circulating channels and the outward circulating channels are disposed alternately and separately.

4. An electronic device, comprising:

an electronic device body, wherein a heat exchanging module is disposed to the electronic device body and comprises:

a casing;

a plurality of first air guiding elements disposed in the casing, wherein each of the first air guiding elements comprises a plurality of first structures and a plurality of second structures, the first structures are disposed parallelly, and the second structures are disposed between the first structures and connected with the first structures to form a plurality of first channels;

a plurality of first separation elements, wherein each of the first separation elements is disposed between the two adjacent first air guiding elements; and a plurality of second separation elements, wherein each of the second separation elements are disposed between the adjacent two first air guiding elements, and the first separation elements and the second separation elements are respectively disposed along two opposite edges of the corresponding two first air guiding elements to form a plurality of second channels, and an airflow direction of the first channels is different from that of the second channels, wherein the airflow direction of the first channels is toward a constant direction, and the airflow direction of the first channels and the airflow direction of the second channels form an included angle of 90° in a projection direction.

5. The electronic device as recited in claim 4, wherein the first channels have identical airflow direction, and the second channels have identical airflow direction.

6. The electronic device as recited in claim 4, wherein the first channels and the second channels are inward circulating channels and outward circulating channels respectively or outward circulating channels and inward circulating channels respectively, and the inward circulating channels and the outward circulating channels are disposed alternately and separately.

* * * * *